(12) United States Patent
Henson et al.

(10) Patent No.: US 6,607,950 B2
(45) Date of Patent: Aug. 19, 2003

(54) MIS TRANSISTORS WITH A METAL GATE AND HIGH-K DIELECTRIC AND METHOD OF FORMING

(75) Inventors: Kirklen Henson, Leuven (BE); Rita Rooyackers, Leuven (BE); Serge Vanhaelemeersch, Leuven (BE); Goncal Badenes, Leuven (BE)

(73) Assignee: Interuniversitair Microelektronic Centrum (IMEC), Leuven (BE)

( * ) Notice: Subject to any disclaimer, the term of this patent is extended or adjusted under 35 U.S.C. 154(b) by 0 days.

(21) Appl. No.: 09/823,893

(22) Filed: Mar. 30, 2001

(65) Prior Publication Data

US 2001/0049183 A1 Dec. 6, 2001

Related U.S. Application Data (60) Provisional application No. 60/193,854, filed on Mar. 30, 2000.

(51) Int. Cl.[7] .............................................. H01L 21/336
(52) U.S. Cl. ...................... 438/197; 438/585; 438/586; 438/595; 438/596
(58) Field of Search ................................ 438/197, 585, 438/586, 595, 596

(56) References Cited

U.S. PATENT DOCUMENTS

| | | | | |
|---|---|---|---|---|
| 5,960,270 A | | 9/1999 | Misra et al. | |
| 6,033,963 A | * | 3/2000 | Huang et al. | |
| 6,054,355 A | * | 4/2000 | Inumiya et al. | |
| 6,087,231 A | * | 7/2000 | Xiang et al. | |
| 6,137,126 A | * | 10/2000 | Avanzino et al. | |
| 6,143,593 A | * | 11/2000 | Augusto | |
| 6,177,303 B1 | * | 1/2001 | Schmitz et al. | |
| 6,232,625 B1 | * | 5/2001 | Bartsch et al. | |
| 6,251,763 B1 | * | 6/2001 | Inumiya et al. | |
| 6,310,367 B1 | * | 10/2001 | Yagishita et al. | |
| 6,380,039 B2 | * | 4/2002 | Badenes et al. | |
| 6,383,884 B1 | * | 5/2002 | Shiozawa et al. | |

FOREIGN PATENT DOCUMENTS

EP          0929105          7/1999

OTHER PUBLICATIONS

U.S. patent application Ser. No. 09/283,709, Badenes et al., filed Apr. 1, 1999.
U.S. patent application Ser. No. 09/552,980, Maex et al., filed Apr. 21, 2000.

* cited by examiner

*Primary Examiner*—Long Pham
(74) *Attorney, Agent, or Firm*—Knobbe, Martens, Olson & Bear LLP (57) ABSTRACT

A replacement gate process is disclosed comprising the steps of forming a dummy gate stack on a substrate, depositing a PMD layer on the substrate and polishing this PMD layer to expose the top surface of the dummy gate stack. The dummy gate stack can be removed selective to the spacers and the PMD layer. SiC is used as spacer or CMP stop layer to improve the uniformity of the PMD CMP step. SiC can also be used as etch stop layer during the etching of the contact holes or during the formation of a T-gate.

30 Claims, 10 Drawing Sheets

Table 1:

| Sample | Thickness, nm | Range, nm | Std.dev., nm | 3σ unif., | Etch rate, nm/min |
|---|---|---|---|---|---|
| SiC as deposited | 202.333 | 22.996 | 7.9 | 11.7 | - |
| SiC+20sBT | 147.954 | 21.398 | 7.016 | 14.1 | 163.14 |
| SiC+20s ME | 181.191 | 24.117 | 8.79 | 14.6 | 63.42 |
| SiC+40s OE | 191.596 | 23.512 | 8.244 | 12.9 | 16.10 |

FIG. 13

Table 2:

| Sample | Break Through | Main Etch | Over Etch |
|---|---|---|---|
| TEOS oxide | 1.43 | 1057 | α |
| Thermal oxide | 1.48 | 1057 | α |
| Nitride | 1.1 | 12.49 | 16.09 |

FIG. 14

MIS TRANSISTORS WITH A METAL GATE AND HIGH-K DIELECTRIC AND METHOD OF FORMING

PRIORITY

This application claims the priority of U.S. provisional application No. 60/193,854 filed on Mar. 30, 2000.

FIELD OF THE INVENTION

The invention relates to a method for forming Metal Insulator Silicon transistors and devices obtained thereof. The metal gate and high-k dielectric are introduced using a replacement gate process.

STATE OF ART

High-k gate dielectrics and metal gate electrodes will be required in future CMOS technologies to maintain the performance gains with scaling. The problem of introducing both a new gate dielectric and electrode is unprecedented in conventional CMOS technology. The new materials must solve the electrical limitations of the $SiO_2$/polysilicon gate stack that is still in use and they must be capable of being incorporated in a "CMOS" type of process flow. It is expected that for CMOS and CMOS related technologies having a gate length of 50 nanometer and below, such high-k gate dielectrics and metal gate will become a necessity. Because the new materials for the gate stack, comprising dielectric and electrode, are still under investigating in research projects world wide, a baseline process for transistor fabrication is required that allows research to be performed on different materials while minimising cross-contamination in the tools. The research will be done in an available standard CMOS production line or an R&D environment. If a conventional CMOS process sequence is used the gate stack is defined after definition and implantation of the active area regions and prior to the formation of the spacers and the junctions. In such sequence the front-end-of-line process tools might be exposed to the metal containing dielectric and gate. Therefore precautions have to be taken to avoid contamination due to the high-k dielectric and/or metal gate of the standard CMOS process tools. Such baseline process although initially intended for research, may later also be used in production environment.

In patent application EP0929105 a metal gate sub-micron MOS transistor and the method for making such a device is disclosed. This process sequence is straight forward, forming a gate stack comprising an oxide dielectric and a metal gate. This method consists of the steps of forming the standard gate stack but also including a nitride top layer, oxide spacer formation and Pre-Metal-Dielectric (PMD) formation. The PMD layer will be planarised using Chemical Mechanical Polishing (CMP) to expose the nitride layer on top of the gate stack. This nitride is removed by wet etch, while leaving the underlying polysilicon gate and gate oxide intact. Similar to the dual damascene technology used in back-end of line processing, via holes and trenches are defined in the PMD stack to be able to contact the source-drain regions and to form the metal wiring. Metal is deposited in these via holes, trenches and on top of the polysilicon gate. The metal will interact with the polysilicon during subsequent annealing steps converting the polysilicon gate into a silicide material, which acts as a metallic gate.

In U.S. Pat. No. 5,960,270 another method for forming a metal gate MOS transistor is disclosed. A polysilicon/silicon oxide gate stack is formed on a substrate, followed by the formation of the spacers and the junctions. A nitride layer is deposited overlying the semiconductor device and the substrate. On top of this nitride layer the inter-level dielectric (ILD) layer is formed. The ILD layer will be polished using the polysilicon layer as a polish stop, so having the top surface of polysilicon gate exposed. This polysilicon gate will be removed and replaced by a metal gate. Optionally the gate oxide is also replaced e.g. by a high-k dielectric layer.

SUMMARY OF THE INVENTION

One aspect of the invention is directed toward a replacement gate technology that provides a robust process flow to fabricate transistors with different high-k dielectrics and metal gates. The replacement gate process is an alternative process sequence that can be used to fabricate devices without any specialised processing tools, i.e. it can be executed in a standard CMOS production line and R&D environment, without contaminating the front-end-of-line tools. This replacement gate process also provides the advantage of performing the high thermal budget processes prior to deposition of the metal gate electrode. Such a process flow allows the investigation of the properties of high-k dielectrics and/or metal gates in a standard CMOS processing environment.

Another aspect of the present invention offers a replacement gate process sequence having good planarization properties.

Another aspect of the invention uses SiC as oxide and/or metal CMP stop layer, etch stop layer or spacer material.

Another aspect of the invention relates to the etching and removal of SiC using a dry etching process that can be performed in a standard process tool.

A method for forming a replacement gate structure comprising the steps of:

providing a semiconductor substrate;

forming a temporary stack wherein the top layer of said stack is made of a first material, said stack further comprising oxide and/or polysilicon;

forming spacers wherein said spacers are made of a second material, that can be etched selectively to said first material;

said first and said second material are selected from the group of SiC and nitride;

depositing a dielectric layer;

polishing said dielectric layer and exposing the top layer of said temporary stack;

removing the temporary stack and creating a cavity;

depositing in said cavity a high-k dielectric and a thin film, wherein said thin film is selected from the group of polysilicon or a metal;

depositing a tungsten layer; and polishing said tungsten layer to expose the surface of said polished dielectric layer.

A method for forming a replacement gate structure comprising the steps of:

providing a semiconductor substrate;

forming a temporary stack wherein the top layer of said stack is made of a first material, said stack further comprising oxide and/or polysilicon;

forming spacers wherein said spacers are made of a second material, that can be etched selectively to said first material;

said first and said second material are selected from the group of SiC and nitride;

depositing a dielectric layer;

polishing said dielectric layer and exposing the top layer of said temporary stack;

depositing a layer of said first material;

patterning said layer of said first material above said temporary stack and removing said top layer of said temporary stack;

further removing the temporary stack and creating a cavity;

depositing in said cavity a high-k dieletric and a thin film, wherein said film consists of polysilicon or a metal;

depositing a tungsten layer; and polishing said tungsten layer.

A method for forming a replacement gate structure comprising the steps of:

providing a semiconductor substrate;

forming a temporary stack wherein the top layer of said stack is made of a first material, said stack further comprising oxide and/or polysilicon;

forming spacers wherein said spacers are made of a second material, that can be etched selectively to said first material;

said first and said second material are selected from the group of SiC and nitride;

depositing a dielectric layer;

polishing said dielectric layer and exposing the top layer of said temporary stack;

removing the temporary stack and creating a cavity;

depositing in said cavity a high-k dielectric and a thick film, wherein said film is selected from the group of polysilicon or a metal;

patterning said thick film such that said cavity is overlapped.

A method for forming a replacement gate structure wherein said SiC layer is etched selectively to oxide, polysilicon or nitride using a dry etch process.

A method for forming a replacement gate structure wherein said high-k dielectric and/or said thin metal film are deposited by ALCVD.

In all following paragraphs "nm" means nanometer.

SHORT DESCRIPTION OF THE DRAWINGS

All drawings are intended to illustrate some aspects and embodiments of the present invention. Devices and fabrication steps are depicted in a simplified way for reason of clarity. Not all alternatives and options are shown and therefore the invention is not limited to the content of the given drawings.

FIG. 3: cross section SEM images of the poly Si/SiC dummy gate stack.
 a)—isolated line 0.175 µm and b) line/space pattern 0.175/0.2 µm
FIG. 4: cross section SEM images of the poly Si/TEOS/SiC dummy gate stack.
 a)—isolated line 0.175 µm and b) line/space pattern 0.175/0.2 µm

FIG. 9: a. cross section of a wafer illustrating the differences in oxide height on top of large/dense or small/isolated structures after PMD formation.
 b. top view of large transistor with the gate overlapping the field region. The remaining field area is covered with a protective layer (13).
 c. top view of large transistor with the gate overlapping the field region. The field area and the active area outside the gate region is covered with a protective layer (13).

DETAILED DESCRIPTION OF THE INVENTION

For the purpose of teaching of the invention, preferred embodiments of the method are described. It will however be apparent to the person skilled in the art that other alternative and equivalent embodiments of the invention or combinations thereof can be conceived and reduced to practice without departing from the true spirit of the invention.

In a first aspect of the invention a replacement gate process is presented to provide a process flow to fabricate transistors with different high-k dielectrics and metal gates.

In a first embodiment the gate electrode comprises polysilicon or TiN. The replacement gate process follows in this example a standard 180 nm CMOS process as much as possible; however, there are several critical steps that deviate from this standard CMOS process sequence. Within each of these critical process steps there are several options to consider. The following section describes the replacement gate process flow with a detailed description on the critical process steps and a comparison of the various options. Since the purpose is to have a robust process to do research on high-k dielectrics and metal gate electrodes, the process that requires the least amount of development is pursued. The replacement process sequence according to this first embodiment comprises the steps of:

1. Definition of Active Area

Active area regions (7) are formed in the semiconductor substrate, preferably a silicon substrate. The active area regions (7) are preferably isolated from each-other by applying the Shallow Trench Isolation (STI) technique to define the field regions (1) as is used as known to the state-of-the art. Other isolation techniques such as LOCOS (local oxidation of silicon) can be applied but might cause difficulties during the step of exposing the polysilicon gate, as will be explained later on.

2. Formation of the Dummy Gate Stack

Figure 1A:
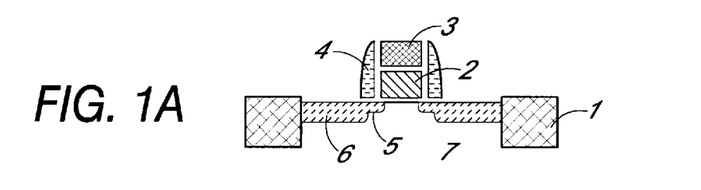
FIGS. 1a–g: schematic illustration of some steps of a replacement gate process sequence according to an embodiment of the invention

A dummy gate stack (2) comprising polysilicon and gate oxide will be formed. Preferably the gate oxide is in the range of 2 to 10 nm and the polysilicon layer is in the range of 90 to 150 nm. This gate stack will be replaced later on by the desired combination of metal gate electrode and high-k dielectric under investigation. (see FIG. 1a). The properties of the dummy gate stack are also determined by the requirements of the CMP process executed in step 4 below. The top layer (3) of the dummy gate stack (2) can be nitride, SiC or any other material that offers the desired selectivity with respect to CMP of the PMD layer, etching of the dummy gate stack and selective silicidation of the source-drain regions as will be explained in the corresponding process steps below.

3. LDD/Spacer/HDD Formation

In the active area region ((7) the lowly doped implant region (LDD) or gate extensions (5), the spacers (4) and the highly doped implant region (HDD) (6) are formed self-aligned to the dummy gate stack (2). This process sequence is also used in the conventional CMOS process sequence.

The source-drain regions adjacent to the gate region, comprising the dummy gate stack (2) and the spacers (4), can be silicided. If the source-drain regions are silicided, this silicide layer will act as an etch stop layer during the etching of contact holes in the PMD layer. These contact holes will be filed with conductive material, e.g. W, TiN, Al or other metals, to electrically contact the source-drain regions. If the source-drain regions are not protected with such an contact-etch stop layer, the silicon of the source-drain regions will be etched or removed during the opening of these contacts, yielding low-quality junctions or even short circuiting of the contact metal with the silicon substrate in which the source-drain junctions are formed.

In U.S. application Ser. No. 09/552,980, hereby incorporated by reference in its entirety, methods for forming silicide layers are disclosed. If the top layer (3) of the dummy gate stack is of a material, e.g. nitride or SiC, that will essentially not react with Ti, Co or other materials applicable for silicide formation, a selective silicidation of only the source-drain regions can obtained. The top layer (2) acts as an silicide-inhibiting layer. If the top layer (2) would react with the refractory metal used to form a silicide, e.g. a polysilicon top layer reacting with Ti or Co, the thus formed silicide layer might be difficult to be removed using standard etching techniques. The removal of a silicided dummy gate might hence require additional process development or etching steps additional to the process steps according to this invention

4. Pre-Metal-Dielectric Formation (PMD)

Figure 1B:
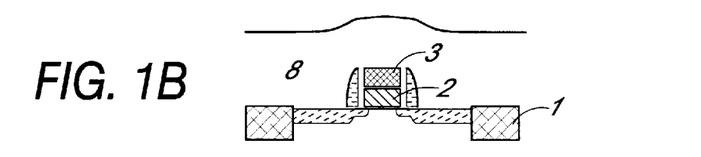
Figure 1C:
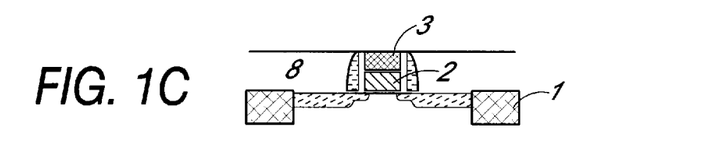

A PMD layer (8) is formed covering the field or STI regions (1) and the active area regions (7) comprising the gate area and the source-drain and gate regions. (see FIG. 1b) This PMD layer can be a conformal layer of 180 nm, such as an Chemical Vapour Deposited (CVD) oxide, a TEOS layer, a PSG-layer, a spin-on-dielectric or any other material that can be polished and planarised using a CMP process. The PMD layer is removed during the CMP step, until the top surface (3) of the dummy gate stack (2) is exposed. (see FIG. 1c). Depending on the composition of the dummy gate stack the top layer (2) or the polysilicon gate itself will act as a polish stop layer. The polishing process can be selective to the top layer (2), i.e. it removes the PMD layer at a higher rate than it removes the top layer (2). This selectivity in removal rate can be expressed as a ratio of the removal rate of the PMD layer to the removal rate of the top layer (3) This ratio is higher than 5, preferably higher than 10.

5. Removal of the Dummy Gate Stack

Figure 1D:
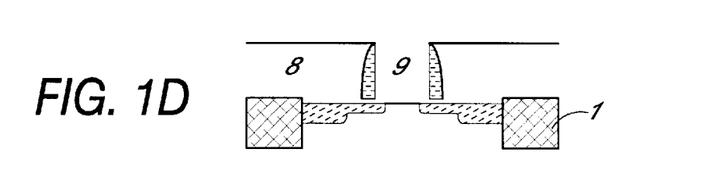

The PMD layer needs to be polished to the extent that the dummy gate stack is exposed and can be removed. Some overpolishing of the dummy gate stack is therefore tolerable. The polishing process may completely or partially remove the top layer (3) and stop on the underlying gate electrode (2b) The removal of the dummy gate stack will be done selective, i.e. without substantially removing or etching, to the PMD layer, the spacers and the underlying materials forming part of the dummy gate stack. For example: SiC or nitride if used as top layer in the dummy gate stack will be removed selective to the underlying polysilicon electrode. The polysilicon gate electrode will in its turn be selectively removed to the underlying gate oxide and finally the gate oxide itself will be selectively removed to the semiconductor substrate. (see FIG. 1d) formation of the metal electrode—high k dielectric stack The cavity (9) created by the removal of the dummy gate stack (2) is filled by the desired combination of high-k material (10) and metal gate electrode material (11). This deposition can be done selective. This deposition can be done non-selective and hence the deposited layers cover the PMD surface and fills the cavity.

6. Patterning of the Gate

Figure 1E:
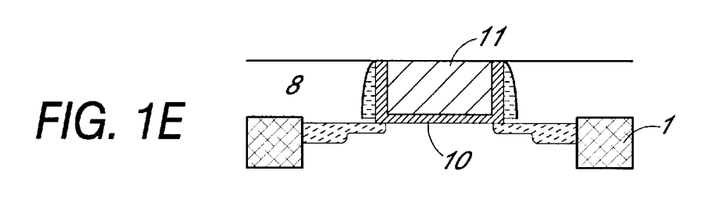

In case of a non-selective deposition of the metal gate stack the metal layer and/or the underlying high-k dielectric can be polished until the PMD surface is exposed (see FIG. 1e). The cavity remains substantially filled with the metal of the metal gate electrode.

7. Formation of Metal Wiring

On top of the PMD layer (8) and the metal gate (11) a metal layer or stack of metal layers can be deposited and patterned to form an interconnect patterning to interconnect the transistors. Prior to the deposition of the interconnect metal via or contact holes can be etched in the PMD layer to allow the connection of the source-drain regions.

Some of the process steps in the above sequence will be discussed in detail below. Various alternatives within the scope of the present invention will be presented during this discussion.

Formation of the Dummy Gate Stack

Wafers are processed using a standard 180 nm process sequence up to the gate stack including active area definition by STI and well formation. Any 180 nm CMOS process flow as know to persons skilled in the art can be used. This obtained gate stack or feature comprising polysilicon and silicon oxide is called dummy gate stack as this total stack will be removed after PMD formation and replaced by a gate stack having the desired composition.

Figure 2A:
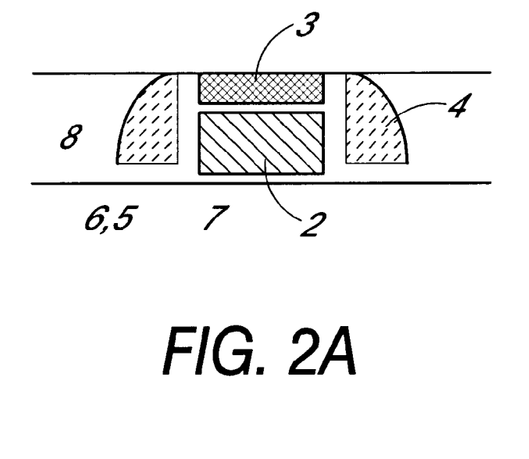
FIGS. 2a–b: cross section of a transistor illustrating the use of nitride as both spacer and CMP stopping layer.
Figure 2B:
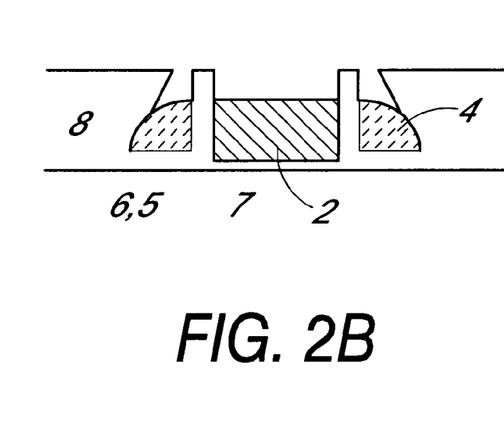
Figure 3A:
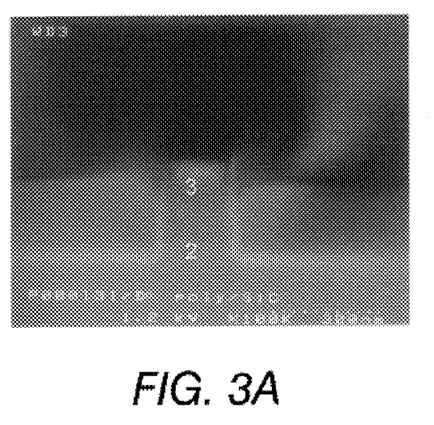
Figure 3B:
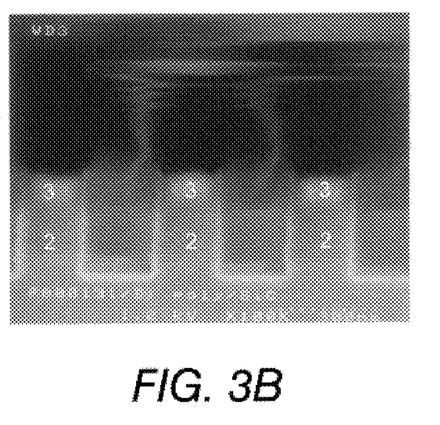
Figure 4A:
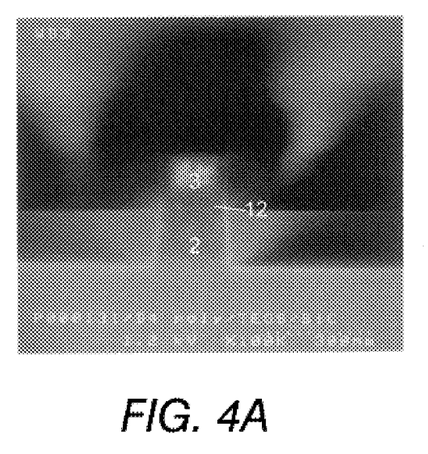
Figure 4B:
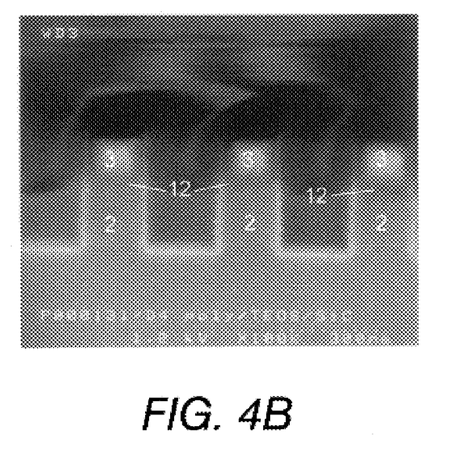

At this point there are several options for the gate stack. The capabilities of the CMP process, used to polish the PMD or planarising layer (8) deposited later in the process flow, determines many of the dummy gate stack properties. One can use silicon nitride as top layer (3) in the stack and as spacer material. The polishing of the Pre-Metal-(PMD) will be selective to this top layer acting as a polish-stop layer. However, using silicon nitride is undesirable since the spacer preferably comprises silicon nitride as such material withstands the HF-based wet processing steps of cleaning and oxide removal present in any CMOS process. Oxide spacers can be used as is done in EP0929105, but nitride spacers allow better control of spacer dimensions, which is of importance in submicron CMOS technologies. After planarising the oxide (8) of the PMD layer by CMP until the nitride top layer (3) of the dummy gate stack (2) is exposed, the nitride layer of the gate must be removed. During this removal step also the nitride spacer (4) is attacked. FIG. 2 provides a simple illustration of the dummy gate stack after oxide CMP (FIG. 2a) and then after removal of the nitride cap (FIG. 2b). Although some loss of the spacer material (4) during the removal of the top layer (3) and of the dummy gate stack (2) is tolerable, it must be avoided that during the deposition of the metal gate (11), metal will fill the cavity created by removing at least partially the nitride spacers. In thus-formed openings the metal gate might be short-circuited with the source-drain areas (5,6).

The present invention solves this problem by introducing a new CMP stopping layer or spacer material. Silicon Carbide, (SiC), e.g. Amorphous SiC, can be used as spacer material and nitride as stopping layer on top of the dummy gate stack or vice versa.

The use of SiC as the CMP stopping layer or as spacer material introduces a first change in standard CMOS processing with respect to the replacement gate process. The critical features with respect to the use of SiC as polish, etch stop layer or spacer material to consider are:

Etching and patterning of the SiC when forming the dummy gate stack as it is part of the dummy gate stack as presented in this invention. The SiC layer is used as top layer (3) of the dummy gate stack (2). SiC can be patterned to obtain small gate lengths, e.g. 180 nm or smaller gate length dimensions that are already feasible with polysilicon gates. SiC as top layer can also serve as a bottom anti-reflecting coating (BARC) layer. Such an ARC-layer can be required when defining small patterns or lines in a resist. Instead of additionally providing this layer during the litho processing when the anti-reflecting coating and resist is deposited on top of the wafer, the SiC layer can be deposited on the blanket dummy gate stack before entering the litho processing steps. Contrary to standard anti-reflecting coatings, this SiC is to remain on the wafer after the etch of the gate stack and subsequent resist removal thereby serving as a CMP stopping layer in case nitride spacers are formed.

The properties of SiC doesn't change after or during the sidewall spacer process and RTP anneal of the junctions. Otherwise the SiC may lose the desired properties for CMP stop and make removing the dummy gate difficult. The CMP of the PMD layer must be done selective to the SiC acting as a polish stop layer.

SiC can be removed with sufficient selectivity to TEOS, thermal oxide, polysilicon and silicon nitride. If SiC is used in the dummy stack as top layer or as etch stop layer it is etched away selectively with respect to the underlying and surrounding layers.

Etch rate and selectivity (ERS) tests have been done for SiC and for TEOS oxide, thermal oxide, and nitride. All tests have been done on Lam TCP 9400 chamber, A4 platform An CF4/$O_2$ based chemistry, which is used for patterning 0.25 $\mu$m polysilicon gate etching, has been used for the experiments. The ERS tests have been done for the breakthrough (BT), the main etch (ME) and the overetch (OE) steps of the recipe.

Figure 13:
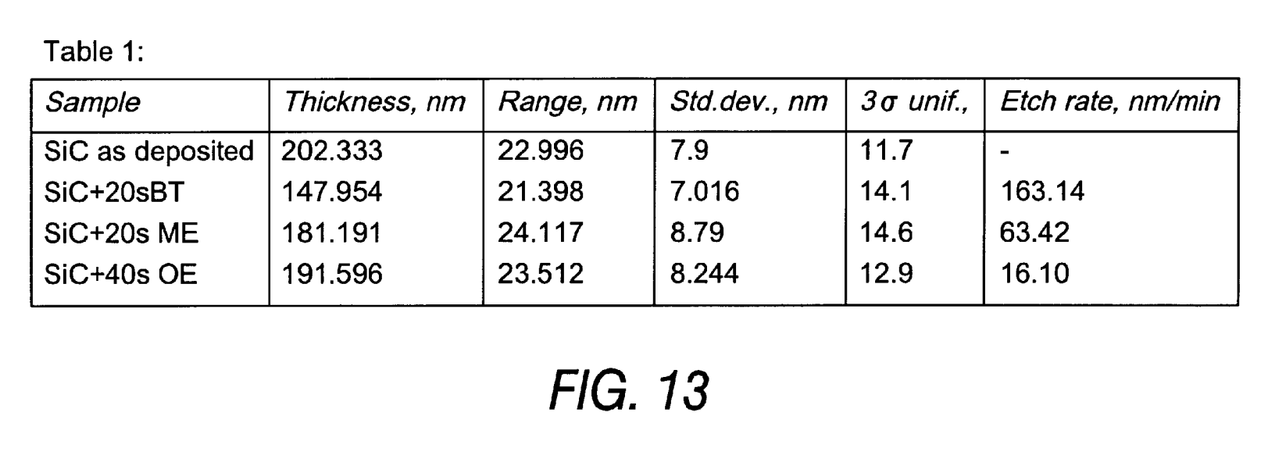
FIG. 13: overview of matrix for etch rate and uniformity test of SiC (Table 1)

The thickness of the SiC layer is measured on KLA-TENCOR ellipsometer F5, which does not allows point-by-point subtraction. Thus, only the total thickness non-uniformity was measured and the not etch rate uniformity as this requires subtraction of results before and after etch. The measurement results are listed in table 1. After 20 s exposure to the break-trough etchant about 50 nm of SiC is removed. Exposure of 200 nm SiC to 20 s of the main-etch step removes about 20 nm of SiC. During 20 s of overetch about 10 nm of the as deposited 200 nm SiC is removed. The table lists also the range of the measurement results, their standard deviation (1 sigma) and 3-sigma uniformity and the etch rate of SiC in the corresponding etching steps.

Figure 14:
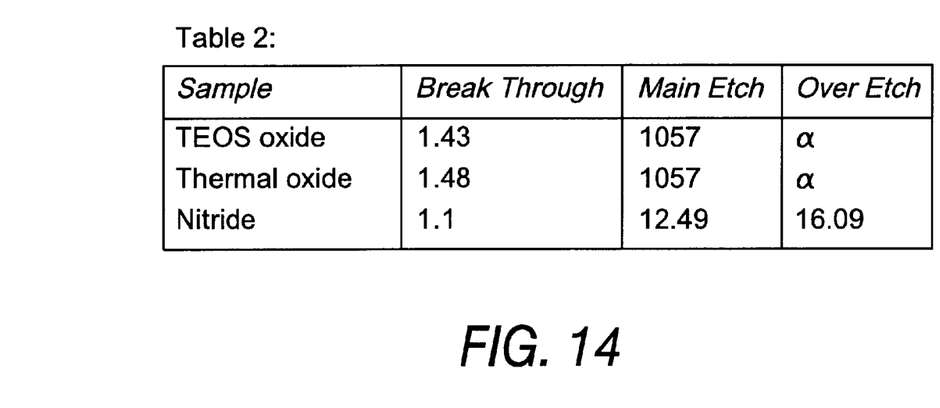
FIG. 14: overview of matrix for etch selectivity of SiC to TEOS, thermal oxide and Nitride (Table 2)

The results that have been obtained for the selectivity tests are listed in table 2. The values were calculated as the ration of SiC etch rate/material etch rate, whereby the material is selected from TEOS, thermal oxide or nitride.

The etch profiles for the poly Si (2)/SiC (3) and poly Si (2)/TEOS (12)/SiC (3) gate stacks are shown in the FIGS. 3a 3b and FIGS. 4a, 4b respectively. The TEOS layer (12) between the SiC (3) and the polysilicon (2) can be used for process control in removing the dummy gate stack later on in the process. As can be seen from these pictures 3a, 3b and 4a, 4b there is no etching trough the gate oxide adjacent to the dummy gate stack. The profile of the etched dummy gate stack has a limited slope.

Figure 5:
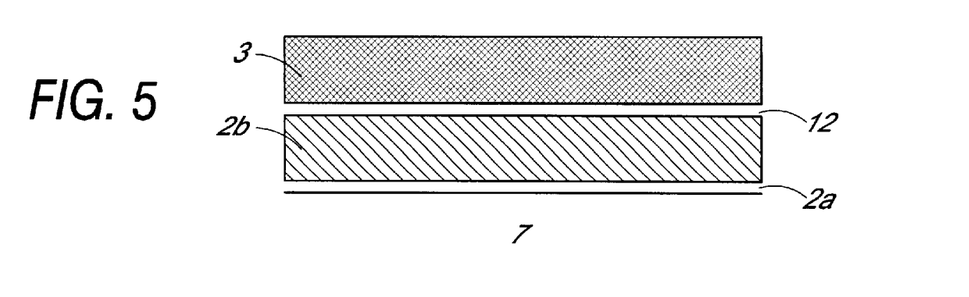
FIG. 5: dummy gate stack comprising 5.5 nm silicon dioxide/150 nm polysilicon/15 nm TEOS/150 nm SiC, according to one embodiment of the invention
Figure 6:
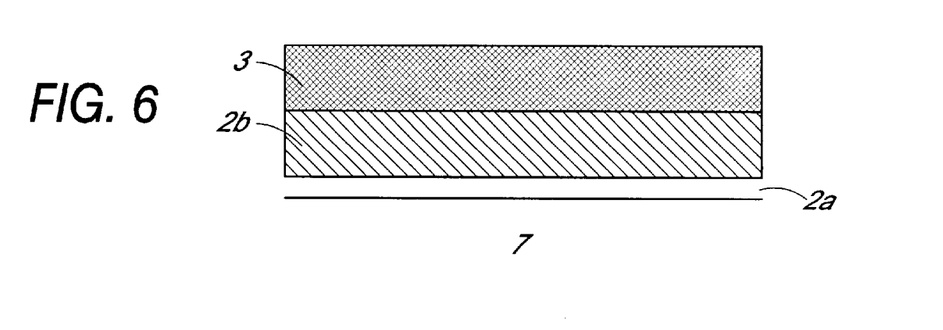
FIG. 6: dummy gate stack comprising 5.5 nm silicon dioxide/150 nm polysilicon/150 nm SiC, according to one embodiment of the invention
Figure 7:
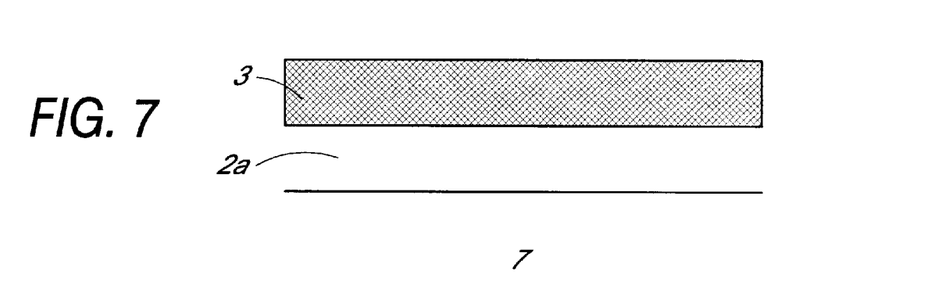
FIG. 7: dummy gate stack comprising 5.5 nm silicon dioxide/200 to 300 nm SiC, according to one embodiment of the invention

Several embodiments of the dummy stack composition are possible. In FIGS. 3 and 4 the etch properties of some embodiments were shown. FIGS. 5 to 7 illustrate some of these embodiments.

Figure 8:
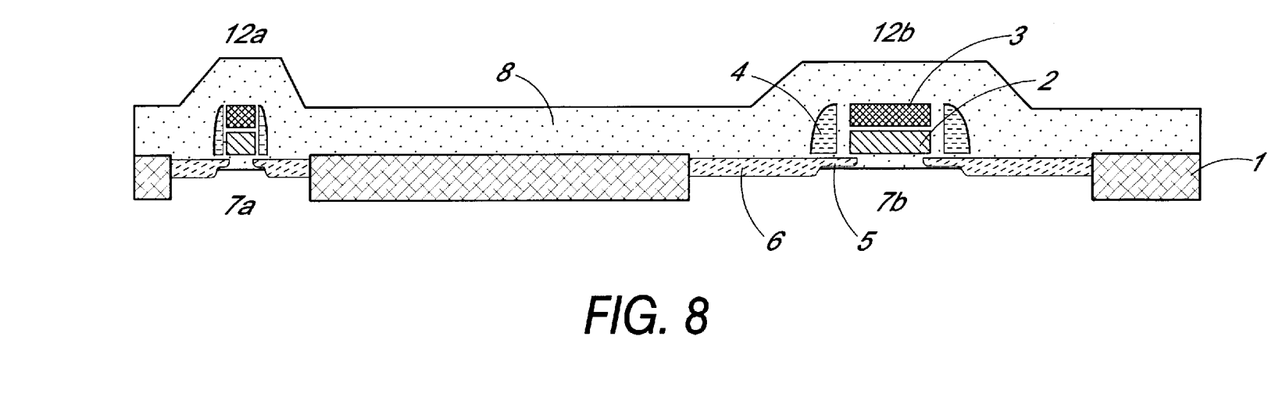
FIG. 8: cross section of a wafer illustrating the differences in oxide height on top of large/dense or small/isolated structures after PMD formation.

It is important to note that the thickness of the layers of the dummy gate stack has to be sufficient to provide adequate process latitude for the oxide CMP step including the topography introduced by the STI. This topography is estimated as having a value at around 50 nm: the top surface of the active area (7) will be about 50 nm lower then the top surface of the field regions (1). Where in FIG. 5 an 15 nm TEOS layer (12) is present between the 150 nm SiC (3) and the 150 nm polysilicon gate electrode (2a) on top of 5.5 nm gate oxide (2b), this 15 nm TEOS layer can be left out as shown in FIG. 6. In this case a HF etch, needed to remove this TEOS layer (12) after removal of the SiC top layer (3) and prior to the removal of the polysilicon gate (2a), can be avoided when removing the dummy gate. Such a HF etch or dip which will also attack the TEOS layer in between the nitride spacers (4) and the dummy gate stack. A method of forming L-shaped nitride spacers is disclosed in U.S. application Ser. No. 09/283,709, hereby incorporated by reference in its entirety. FIG. 7 illustrates the embodiment where the 200 to 300 nm SiC layer (3) is deposited on top of the 5.5 nm dummy gate dielectric (2b), e.g. gate oxide, and no polysilicon gate electrode (2a) is used This embodiment offers an advantage when removing the dummy gate. In this case only SiC must be removed selectively to oxide which simplifies the process. The thickness of this dummy gate stack depends on the loss of SiC during the oxide CMP step. The thickness of the remaining SiC will be the sum of the desired metal gate thickness and of the loss during PMD oxide CMP. As can be seen from FIG. 7 the top surface of the first dielectric layer (8) is substantially coplanar with the top surface of the top layer (3) of the dummy stack. The thickness of the PMD layer (8) is correlated with the height of the gate stack. If as shown in FIG. 8 a protective layer (13) is used, the top surface of this protective layer (12) is also substantially coplanar with the top surface of the of the top layer (3) of the dummy stack.

The SiC layer can be part of the dummy gate stack and as such deposited on top of the blanket polysilicon layer and afterwards patterned together with the patterning of the gate stack.

Figure 1F:
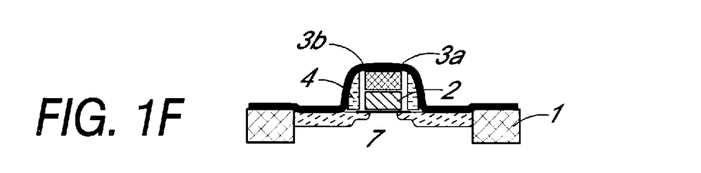

The SiC layer can also be deposited after step 3 "formation of LDD/spacer/HDD" and prior to the formation of the PMD stack. Simultaneously the top layer (3b) of the dummy gate stack (2) and a contact etch stop layer on the source-drain regions is formed. The surface of the substrate is covered with this SiC layer as illustrated in FIG. 1f. The SiC layer can serve as etch step layer when opening the contact or via holes to expose the source-drain regions if no silicide layer is formed. In conventional CMOS processing this silicide layer, e.g. $TiSi_2$ or $CoSi_2$ would act as an etch stop layer to prevent etching of the substrate (7) when etching the holes in the PMD layer (8). If no silicide layer is present, the SiC layer could be used as etch stop layer. In the example in FIG. 1f still a layer of SiC (3a) is present, but this layer can left out, only having a polysilicon/oxide dummy gate stack. The SiC layer used as top layer (3) or as etch stop layer (3b) and top layer (3a) is in the range of 20 to 50 nm.

PMD Formation

A dielectric layer will be deposited. This layer can be the Pre-Metal-Dielectric deposited in a PECVD tool as used in a conventional 180 nm CMOS process. It can be an CVD oxide such as TEOS, PSG or other conformal layers. The thickness of this layer can be between in the range of 50 to 300 nm, preferably 180 nm.

The anticipated problem for the oxide CMP step is the different polishing rates between large and small device features. The topography after the thick oxide deposition can be different for large (12b) and small devices (12a) as illustrated in FIG. 8 in case a PECVD oxide is used. In case of conformal layers the layer thickness of the PMD layer on top of the dummy gates is about the same for large and small devices. The different topography, i.e. small or large dummy gate, isolated or dense structures, leads to a difference in polish rate of the PMD layer depending on the local structure.

Figure 9A:
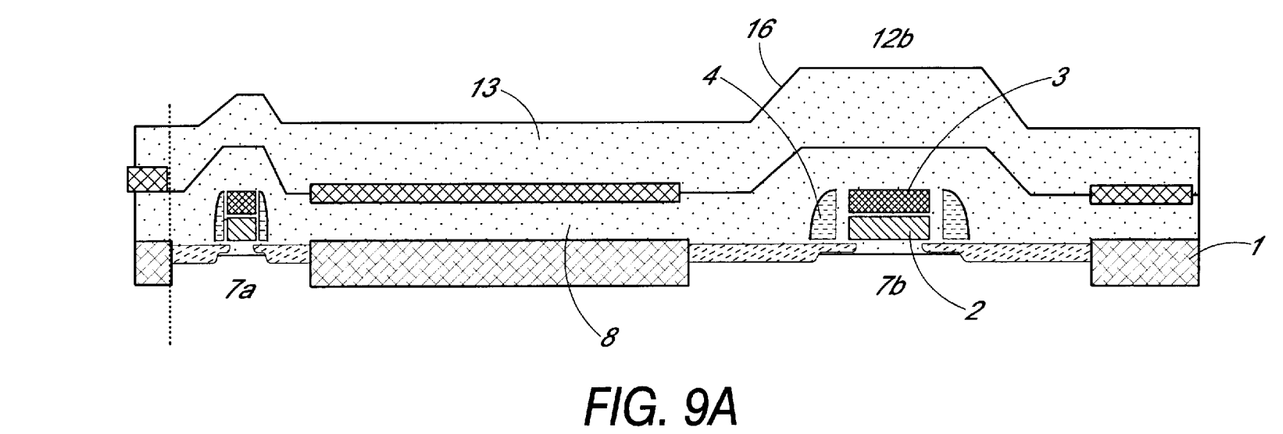

In one embodiment of the invention the topography problem is solved using an additional layer to act as a CMP stopping layer where appropriate. This approach is analogous to e.g. the dual nitride approach applied in an STI process and may require a second mask level to introduce dummy layers of SiC to improve the polish uniformity. SiC dummies could be included to improve the uniformity of the oxide CMP step. (see FIG. 9a) The second polish stopping layer, e.g. SiC (13) is deposited on top of the PMD layer (8) and patterned to only remain in those areas where the polishing speed is too high and the polishing removal process needs to be slowed down. Such area's of excess PMD removal can be areas where the polishing speed is to high, e.g. isolated or small gate structures, or where the PMD thickness is less. The thickness of the second CMP stopping layer (13) is in the range of 20 to 50 nm. FIG. 9a shows a cross section of a wafer prior to the PMD polishing process. In this example the field regions (1) are covered with the patterned second CMP stopping layer (13) preventing the excess oxide removal (8) in the field regions, the so-called dishing effect. Depending on the material chosen for the protective layer (13) one can choose between two approaches.

Figure 9B:
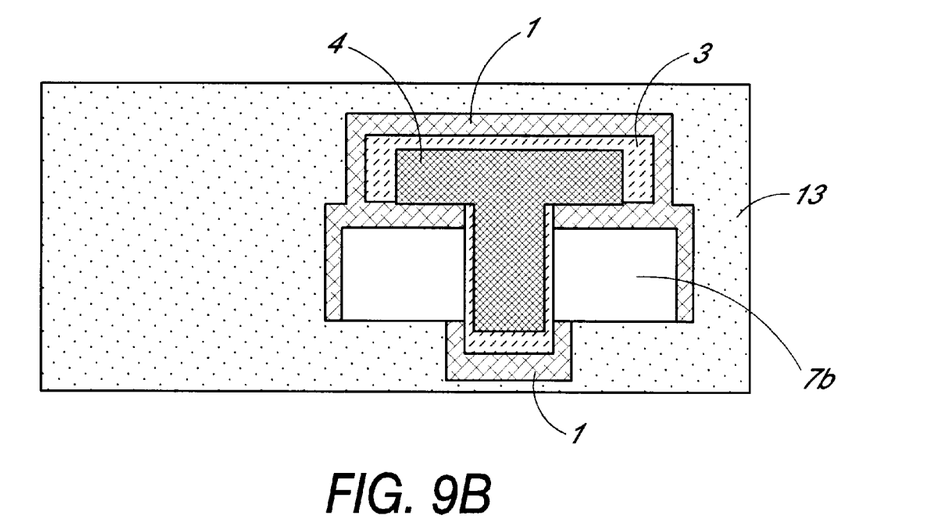
Figure 9C:
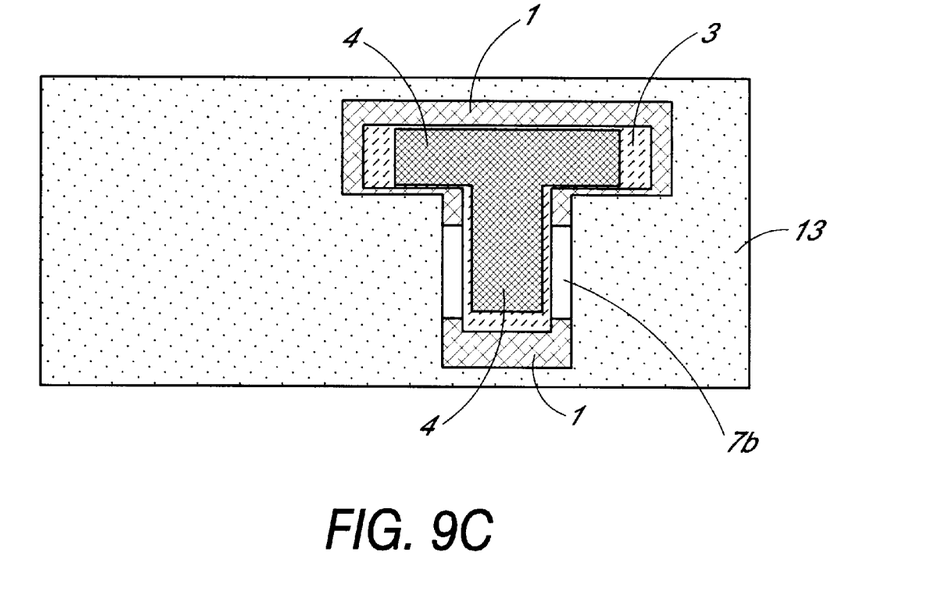

In the first approach the CMP stop layer (13) is not removable or at can at least withstand to the removal of the top layer (3) and the dummy gate stack. The CMP stop layer (13) need not to be removed during subsequent processing of the device, e.g. removal of the dummy stack, substation of the repleacable stack (2) by the replacement gate (10,11) etc. The protective layer (13) could be nitride, while the top layer (2) is SiC and the spacers (4) comprise silicon nitride. In FIG. 9c illustrates this second approach. The protective layer (13) doesn't overlay the active area region (7b). Contact holes can be etched in the PMD layer above the active area (7b) as no non-removable protective layer (13) is present above these regions. If the poly gate (2, 3) overlaps the field region (1), e.g. to from a bonding pad on the field oxide, this overlapping poly area will not be covered with this SiC layer (13) as shown in FIG. 9b. The patterned SiC layer (13) is substantially aligned with the field area (1) not covered with polysilicon.

In the second approach the second CMP stop layer (13) is removable and can preferably be removed together with the top layer (3) of the dummy stack. Preferably this second layer (13) and the top layer (3) are of the same material, e.g. SiC in case nitride spacers (4) are used. In this approach the protective layer (13) is aligned with respect to the area of the poly gate (3) as illustrated in FIG. 9b. The protective layer (13) at least partially overlaps or covers the field regions (1) and the active area regions (7) where these regions are not covered by the top layer (3). The spacing between the gate stack (3) and the second CMP stop layer (13) can be optimised, but is preferably more then 100 nm.

On top of the patterned SiC layer (13) a second conformal layer (16) can be deposited to improve the uniformity and quality of the PMD CMP process. This second conformal layer (16) can be a CVD deposited layer, eg. oxide, or TEOS. The thickness of this second conformal layer is in the range of 50 to 250 nm In one embodiment of the invention the dummy gate stack (2) thickness is increased to account for the CMP process latitude. Preliminary research on high-K dielectrics and metal gates does not require deep sub-micron device dimensions. The simpler approach of increasing the gate stack thickness for improved CMP process latitude while sacrificing the ability to pattern smaller device features can be followed in this case. If the selectivity towards the top layer (3a or 3b) is not high, the gate electrode (2b) might be partially removed during the CMP of the PMD layer. This gate electrode loss is tolerable as long as the cavity (9) is high enough to accept the high-k dielectric (10) and the metal electrode (11). The increased gate stack thickness limits the minimum feature size if the etched profile is not vertical.

Removal of the Dummy Stack

The removal of the dummy gate depends on which option is used as described in the previous embodiments with respect to the formation of the dummy gate stack. The remaining SiC layer (3a, 3b), together with the second SiC CMP stop layer (13) if present, can be removed with a wet etch or more preferably with a dry etch process. If present (see FIG. 5), the TEOS (12) in between the top layer (3) and the polysicilicon gate (2b) can be removed with an HF etch instead of a dry etch step. The bottom polysilicon (2b) can be removed by wet etching, or, more preferably, by dry etching. The silicon gate oxide will be removed with an HF etch.

Deposition of the gate stack and patterning of the gate

The next step is the deposition and patterning of the high-K dielectric and the metal gate. The high-k dielectric (10) can be of the group consisting of the group of Ta2O5, BaTiO3, TiO2, CeO2, BST. PCT application WO 99/17371, hereby incorporated by reference, describes metals applicable for use as metal gate electrode.

In one embodiment a thin layer (11a), preferably a thin metal layer, is deposited after the deposition of the high-k dielectric (10). Such a thin metal layer will determine the electrical properties of the metal gate and is used as fermimetal, i.e. determining the work function difference between the channel of the MIS transistor and the gate electrode. This thin layer can also be selectively formed by ALCVD as explained above, resulting in a thin metal layer on top of the high-k dielectric (10) within the cavity or opening (9). On the thus obtained stack of high-k dielectric (10) and thin metal layer (11a) a thick layer of metal (11b), e.g. copper, can be electroless plated only depositing, e.g. copper, within the cavity of the replacement gate if the appropriate thin metal layer is used. The thin metal film can be formed in a two-step process; first the desired metal film is formed, secondly the metal film required for the plating process is formed.

If, instead of a metal layer (11), a polysilicon layer is deposited on top of the high-k dielectric then only the properties of the high-k dielectric are investigated. The advantage of the approach using a thin layer (11a) on top of the high-k dielectric (10) is that new metals can be introduced without significantly changing the process. The electrically active layer of a metal that determines the difference in workfunction between the gate stack on the active area is on the order of Angstroms. Therefore a thin layer (11a) can be deposited followed by a thick layer of tungsten (11b). With this approach any thin metal film can used as metal gate.

Figure 10A:
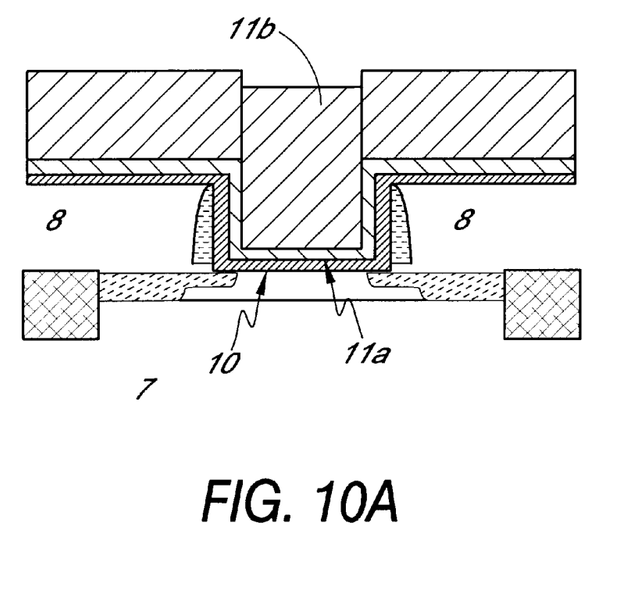
FIGS. 10a–b: Example of CMP process where thin interfacial metal can be changed; however a thick layer of tungsten is always used in process.
Figure 10B:
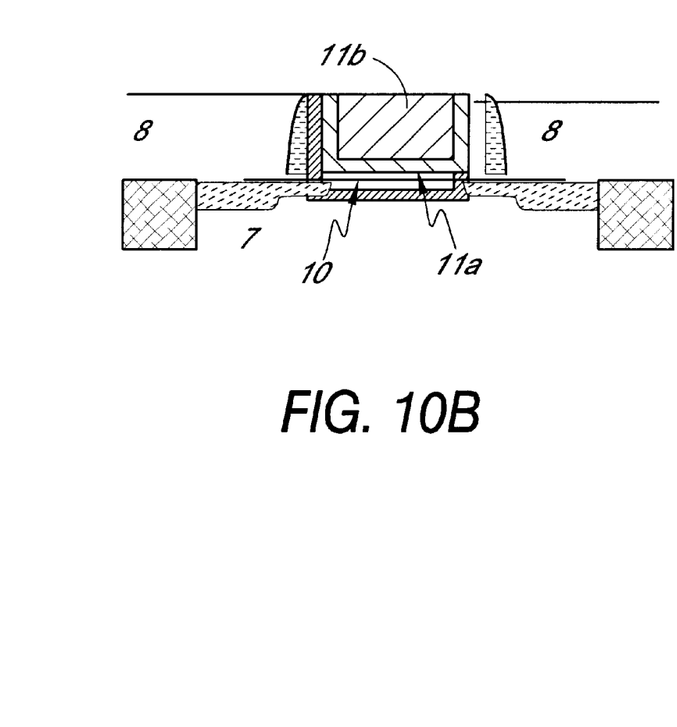
Figure 11A:
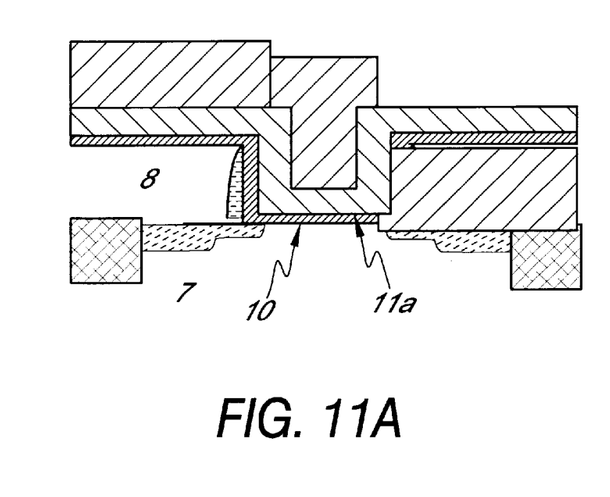
FIGS. 11a–b: Example of CMP process where thin interfacial metal can be changed; however thick layer of tungsten is always used in process
Figure 11B:
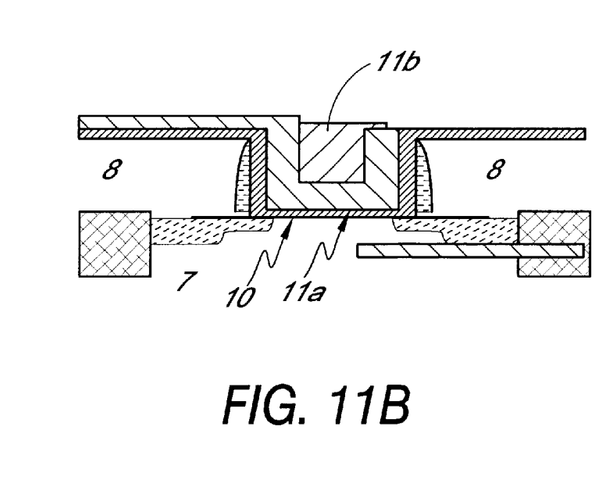

In another embodiment of the invention a thick layer (11b) of tungsten is deposited on top of the thin film (11a) (see FIG. 10a), followed by polishing the tungsten layer (11b) down to the PMD oxide surface (see FIG. 10b). This thin layer can be 10 to 50 nm of polysilicon or TiN. Also Ta, TaN, TaSiN, W, WN, WsiN or Re or TiN can be used. On top of this interfacial layer (11a) the thick metal is deposited all over the wafer covering both the active (7) and field regions (1). During the metal polish step the high-k dielectric (10) on top of the PMD surface is also removed.

Figure 1G:
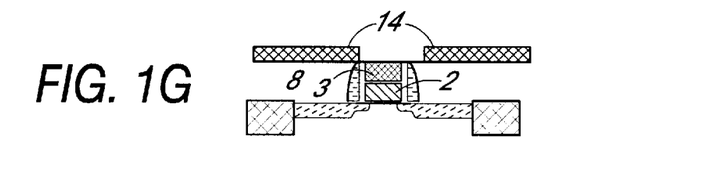

A disadvantage of this metal CMP process can be the dishing of metal for the large device dimensions. This problem of dishing can be solved by depositing a metal CMP stopping layer (14) after the CMP of the PMD layer as shown in FIG. 1g. This layer is opened above the dummy gate stack (2) or above the active area (7). If SiC spacers (4) are used, the PMD or oxide CMP stopping layer (13) and the top layer (3) can be nitride and the metal CMP stopping layer (14) can be SiC. The top layer (3), e.g. nitride, of the dummy stack can be removed e.g. using a wet etch, followed by the removal of the other layers of the dummy gate stack (2) as described above.

Figure 12A:
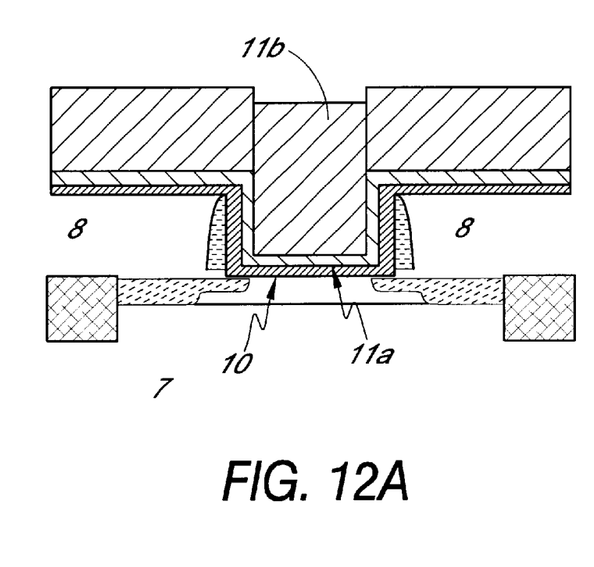
FIGS. 12a–b: Representation of dry etching metal gate.
Figure 12B:
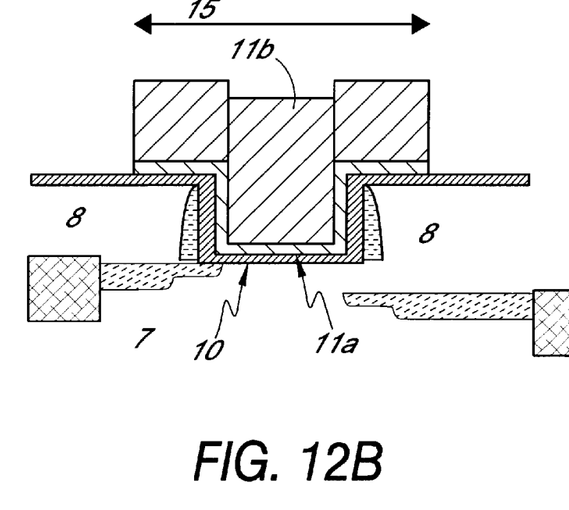

If nitride spacers (4) are used the PMD or oxide CMP stopping layer (13) and the top layer (2) can be SiC as explained above. The metal CMP stopping layer (14) can be nitride. If nitride spacers are used another option is possible. After the CMP of the PMD layer and exposing the SiC top layer (3) of the dummy gate stack (2) a second SiC layer (14) is deposited and patterned. This patterning can also remove the SiC top layer (3) stopping on the polysilicon layer (2b) underneath. The removal of the other layers of the dummy gate stack can proceed as described above. This patterned second layer (14) can also serve as etch stop layer, if, instead of depositing and polishing the thick metal gate (11b), a metal T-gate approach is used. In this T-gate approach again the high-k dielectric (10) is deposited after removing the dummy gate stack (2). On top of this dielectric (10) the replacement gate electrode (11) is deposited, filling the cavity (9) and covering the surface of the PMD stack (8). Polysilicon or TiN/Al can be used as replacement gate material. Instead of polishing this layer down to the surface of the PMD stack, a patterning process comprising the steps of lithographic processing and etching is applied. This step will remove the replacement gate electrode on top of the PMD stack (8), leaving an overlap of the replacement gate electrode (11) over the cavity (9). A second gate is defined overlapping the cavity (9). This is illustrated in the cross sections given in FIG. 12a (after depositing of the replacement gate electrode (11)) and FIG. 12b (after creating the T-gate (15)). The high-k dielectric (10) is deposited followed by the deposition of polysilicon or TiN/Al. If polysilicon is deposited, only the characteristics of the high-k dielectric (10) are investigated. The advantage of this process is the elimination of dishing since there is only an etching step and no CMP step of the replacement metal gate. The dry etch processes for polysilicon and TiN/Al are available.

A disadvantage specific to the use of polysilicon as replacement gate electrode (11) may be the difficulty in doping such a thin polysilicon layer. This is solved by applying an in-situ doping of the polysilicon. If no masking steps are applied the polysilicon will be uniformly doped during the implantation of the single type of dopant. If a thicker layer of polysilicon is needed to allow doping by implantation and to avoid out diffusion of the dopant in to the high-k dielectric, the CMP of tungsten can cause problems. CMP of tungsten is selective to polysilicon and polysilicon stringers might remain at every topography change or variation in topography of the polished PMD surface.

Metal 1

A layer of metal (16) can be deposited on top of the PMD layer and afterwards patterned to create e.g. bond pads for contacting the transistors.

What is claimed is:

1. A method of forming a MIS transistor comprising the steps of
   forming an active area region on a semiconductor substrate;
   forming a temporary gate stack within said active area region, the temporary gate stack comprising a top layer of a first material;
   forming spacers aligned with and adjacent to said temporary gate stack, said spacers comprising a second material, wherein said second material being selectively removable with respect to said first material;
   depositing a first dielectric layer on top of said semiconductor substrate;
   forming a Pre-Metal Dielectric (PMD) layer on top of said first dielectric layer;
   selectively removing said PMD layer at a removal rate that is higher than removal rate of said top layer, until said top layer of said temporary gate stack is exposed;
   removing said temporary gate stack thereby creating a cavity in said first dielectric layer, and
   forming at least in said cavity a stack of a high-k dielectric and a stack of at least one conductive layer.

2. The method as recited in claim 1 wherein said second material comprises nitride.

3. The method as recited in claim 1 wherein said temporary gate stack further comprises a conductive layer and an insulation layer.

4. The method as recited in claim 3 wherein said conductive layer is polysilicon.

5. The method as recited in claim 3 wherein said insulation layer is silicon oxide.

6. The method as recited in claim 1 wherein said first dielectric is a conformal layer.

7. The method as recited in claim 1 wherein said conformal layer is a PECVD deposited oxide layer.

8. The method as recited in claim 1 further comprising the step of depositing a second layer of said first material on top of said semiconductor substrate after the step of forming of said spacers in said second material.

9. The method as recited in claim 1 further comprising the steps of forming a protective layer of said first material on said first dielectric layer, depositing a second dielectric layer on said protective layer of said first material, and wherein the step of polishing said first dielectric layer until said top layer of said temporary gate stack is exposed also comprises the step of polishing said second dielectric layer until said protective layer is substantially exposed.

10. A method as recited in claim 9, wherein said protective layer of said first material is patterned spaced to said top layer.

11. A method as recited in claim 9, wherein said protective layer of said first material is patterned spaced to said top layer and to said active area region.

12. A method as recited in claim 1 wherein the step of forming at least in said cavity a stack of a high-k dielectric and a conductive layer, further comprises the steps of depositing a high-k dielectric depositing at least one conductive layer, and polishing said conductive layer untill said first dielectric layer is exposed.

13. A method as recited in claim 1 wherein the step of forming at least in said cavity a stack of a high-k dielectric and a conductive layer, further comprises the steps of depositing a high-k dielectric depositing a stack of at least one conductive layer on top of said semiconductor substrate, and etching said conductive layer wherein said etched conductive layer overlaps said cavity.

14. A method as recited in claim 12 wherein said stack of at least one conductive layer comprises metal.

15. A method as recited in claim 12 wherein said stack of at least one conductive layer comprises polysilicon.

16. A method as recited in claim 15 wherein said stack of at least one conductive layer further comprises tungsten.

17. A method of forming a metal insulator silicon (MIS) transistor, the method comprising:

forming a gate stack comprising a layer of a first material on top of a semiconductor substrate;

forming a plurality of sidewall spacers that are substantially aligned with and adjacent to the gate stack, the plurality of spacers comprising a second material;

forming a Pre-Metal Dielectric (PMD) layer on top of said first material;

selectively removing said PMD layer at a removal rate that is higher than removal rate of said first material;

removing the gate stack thereby creating a cavity; and forming in at least a portion of the cavity a high-k dielectric layer and a stack of at least one conductive layer.

18. The method of claim 17, wherein the gate stack comprises a gate oxide layer, a polysilicon layer, and a top layer.

19. The method of claim 18, wherein the top layer of the gate stack comprises at least one of SiC and nitride.

20. The method of claim 18, wherein the second material comprises nitride.

21. The method of claim 17, wherein the gate stack comprises a silicon dioxide layer and a SiC top layer.

22. The method of claim 21, wherein the gate stack further comprises a polysilicon layer disposed between the silicon dioxide layer and the SiC top layer.

23. The method of claim 22, wherein the gate stack further comprises a TEOS layer disposed between the polysilicon layer and the SiC top layer.

24. The method of claim 17, wherein forming the PMD layer comprises covering at least a gate regions and a source-drain region, and polishing the PMD layer to expose a top layer of the gate stack.

25. The method of claim 24, wherein a ratio of the removal rate of the PMD layer to the removal rate of the top layer is greater than five (5).

26. The method of claim 24, wherein a ratio of the removal rate of the PMD layer to the removal rate of the top layer is greater than ten (10).

27. The method of claim 24, further comprising selectively forming polishing stop layers on the PMD layer prior to polishing.

28. The method of claim 27, wherein the selectively formed polishing stop layers at least partially remain following removal of a top layer and the gate stack.

29. The method of claim 27, wherein the selectively formed polishing stop layers are removed during removal of a top layer and the stack layer.

30. The method of claim 12, wherein the high-k dielectric comprises at least one of Ta2O5, BaTiO3, TiO2, CeO2, and BST.

* * * * *

UNITED STATES PATENT AND TRADEMARK OFFICE
CERTIFICATE OF CORRECTION

PATENT NO. : 6,607,950 B2  Page 1 of 1
DATED : August 19, 2003
INVENTOR(S) : Henson et al.

It is certified that error appears in the above-identified patent and that said Letters Patent is hereby corrected as shown below:

<u>Title page,</u>
Item [73], Assignee, please delete "Microelektronic" and insert therefor
-- Microelektronica --.

<u>Column 13,</u>
Line 22, please delete "untill" and insert therefor -- until --.

Signed and Sealed this

Twenty-third Day of November, 2004

JON W. DUDAS
*Director of the United States Patent and Trademark Office*